US006423630B1

(12) United States Patent
Catabay et al.

(10) Patent No.: US 6,423,630 B1
(45) Date of Patent: Jul. 23, 2002

(54) PROCESS FOR FORMING LOW K DIELECTRIC MATERIAL BETWEEN METAL LINES

(75) Inventors: Wilbur G. Catabay, Saratoga; Wei-Jen Hsia, Sunnyvale; Dung-Ching Perng, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 63 days.

(21) Appl. No.: 09/704,164

(22) Filed: Oct. 31, 2000

(51) Int. Cl.$^7$ .......................................... H01L 21/4763

(52) U.S. Cl. ...................... 438/624; 438/763; 438/789; 438/790; 438/631

(58) Field of Search ................................ 438/763, 789, 438/790, 624, 631

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |

(List continued on next page.)

FOREIGN PATENT DOCUMENTS

| | | | | |
|---|---|---|---|---|
| JP | 2000-267128 | | 9/2000 | G02F/1/136 |
| WO | WO 97/47038 | * | 12/1997 | |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Bothra, S., et al., "Integration of 0.25 $\mu$m Three and Five Level Interconnect System for High Performance ASIC", *1997 Proceedings Fourteenth International VMIC Conferences*, Santa Clara, CA, Jun. 10–12, 1997, pp. 43–48.

Dobson, C.D., et al., "Advanced SiO$_2$ Planarization Using Silane and H$_2$O$_2$", *Semiconductor International*, Dec. 1994, pp. 85–88.

Fleming, J.G., et al., "Use of Air Gap Structures to Lower Intralevel Capacitance", *1997 Proceedings Third International DUMIC Conference*, Santa Clara, CA, Feb. 10–11, 1997, pp. 139–146.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110; 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

(List continued on next page.)

*Primary Examiner*—Trung Dang
(74) *Attorney, Agent, or Firm*—John P. Taylor

(57) ABSTRACT

A process is disclosed for forming low k dielectric material between and over a plurality of spaced apart metal lines previously formed over a dielectric layer of an integrated circuit structure. The steps include: depositing, over and between the plurality of metal lines, a layer of a first low k dielectric material resistant to via poisoning; then planarizing the layer of first low k dielectric material sufficiently to open voids formed in. the first low k dielectric material between the metal lines; then depositing, over the layer of first low k dielectric material and into the opened voids, a layer of second low k dielectric material capable of filling the opened voids in the layer of first low k dielectric material; and then depositing a layer of a third low k dielectric material resistant to via poisoning over the first low k dielectric material and the voids filled with the second low k dielectric material.

20 Claims, 5 Drawing Sheets

U.S. PATENT DOCUMENTS

| | | | |
|---|---|---|---|
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,278,103 A | 1/1994 | Mallon et al. | 437/240 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,719,084 A | 2/1998 | Mallon et al. | 438/783 |
| 5,837,618 A * | 11/1998 | Avanzino et al. | 438/619 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,930,655 A | 7/1999 | Cooney, III | |
| 5,939,763 A | 8/1999 | Hao et al. | 257/411 |
| 5,989,998 A | 11/1999 | Sugahara et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau | |
| 6,063,702 A | 5/2000 | Chung | |
| 6,066,574 A | 5/2000 | You et al. | 438/781 |
| 6,077,767 A * | 6/2000 | Hwang | 438/422 |
| 6,114,259 A | 9/2000 | Sukharev et al. | 438/789 |
| 6,136,687 A * | 10/2000 | Lee et al. | 438/624 |
| 6,147,012 A | 11/2000 | Sukharev et al. | 438/787 |
| 6,153,524 A | 11/2000 | Henley et al. | 438/691 |
| 6,162,723 A * | 12/2000 | Tanaka | 438/624 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,239,016 B1 * | 5/2001 | Ishikawa | 438/619 |
| 6,277,764 B1 * | 8/2001 | Shin et al. | 438/624 |

OTHER PUBLICATIONS

Shieh, Ben, et al., "Air Gaps Lower K of Interconnect Dielectrics", *Solid State Technology*, Feb., 1999, pp. 51–52, 54, 57–58.

Wolf, S., et al., *Silicon Processing For the VLSI Era*, vol. 1: *Process Technology* (Sunset Beach, CA: Lattice Press, 1986), pp. 171–174.

* cited by examiner

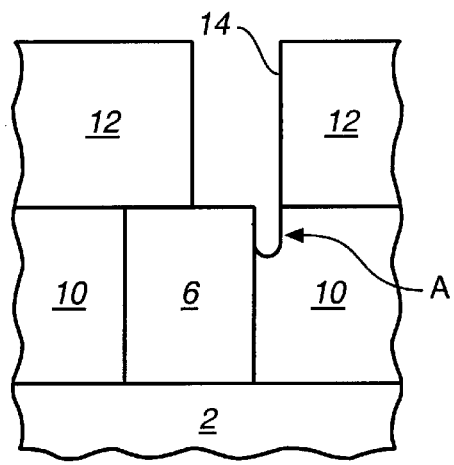
FIG._1A
(PRIOR ART)
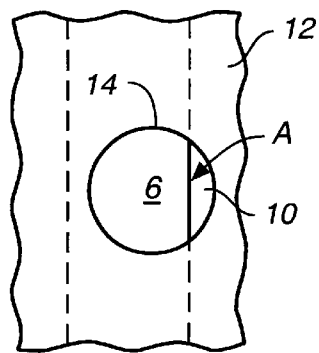
FIG._1B
(PRIOR ART)
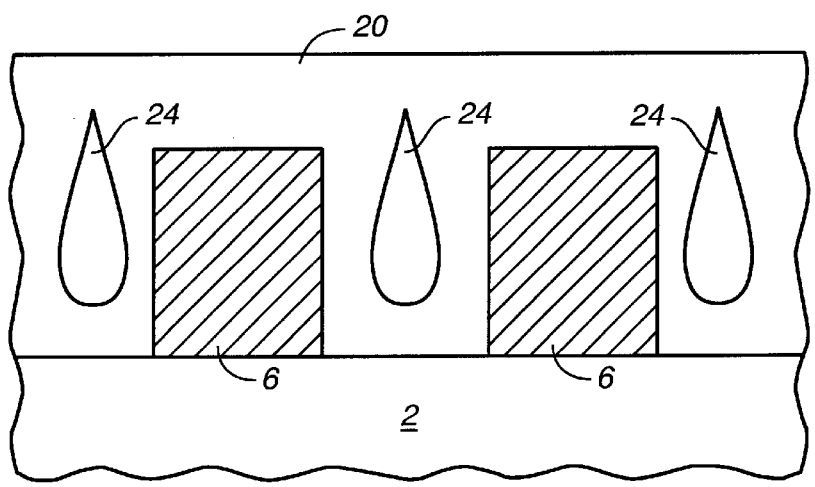
FIG._2
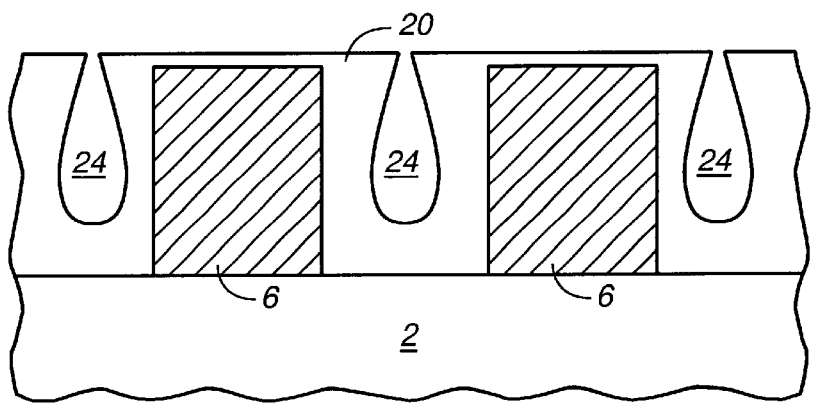
FIG._3

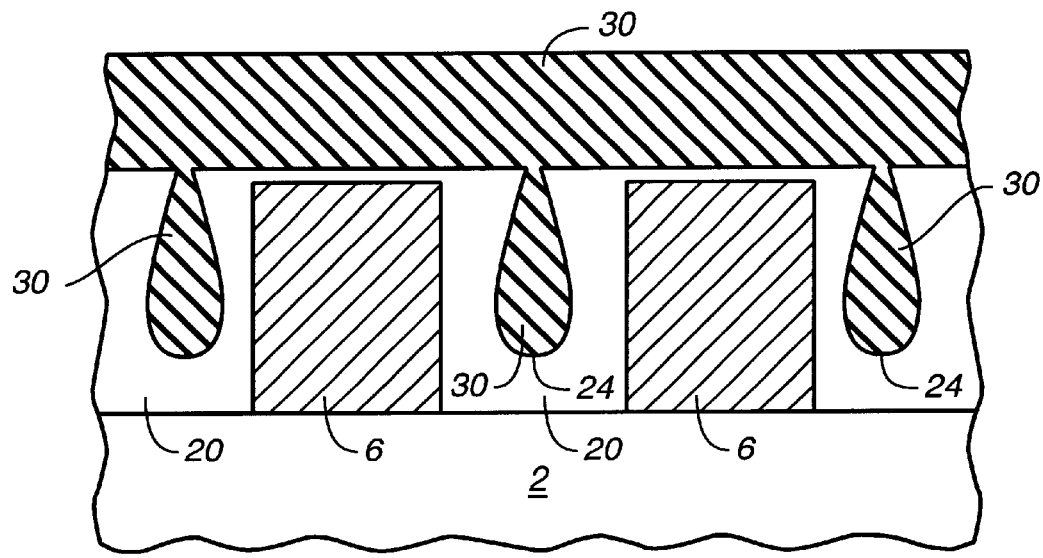
FIG._4
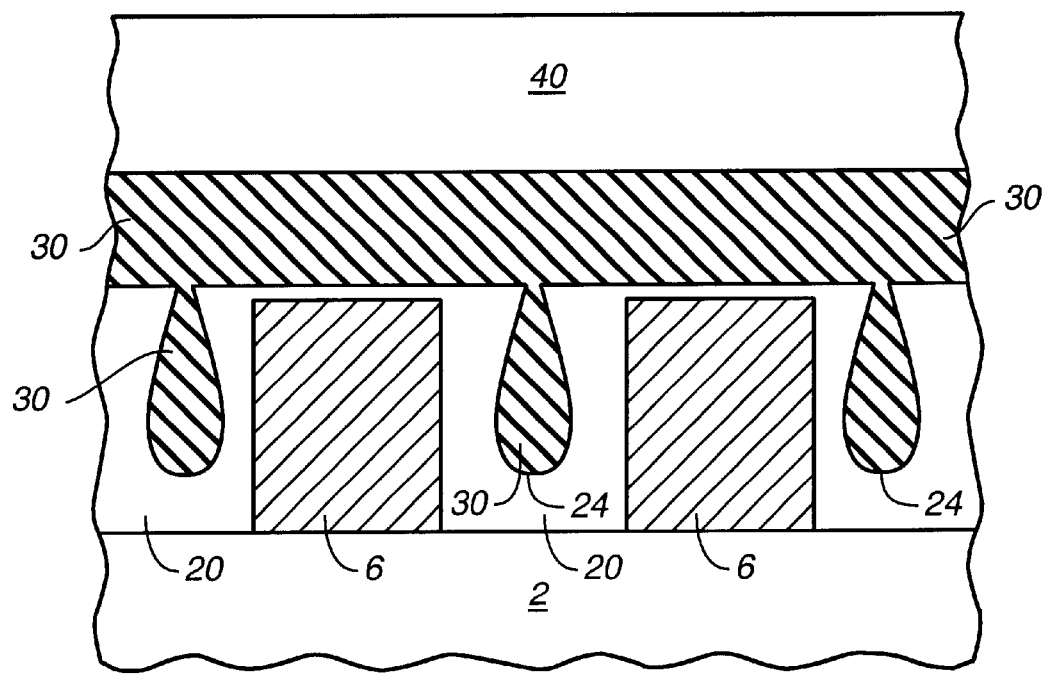
FIG._5A

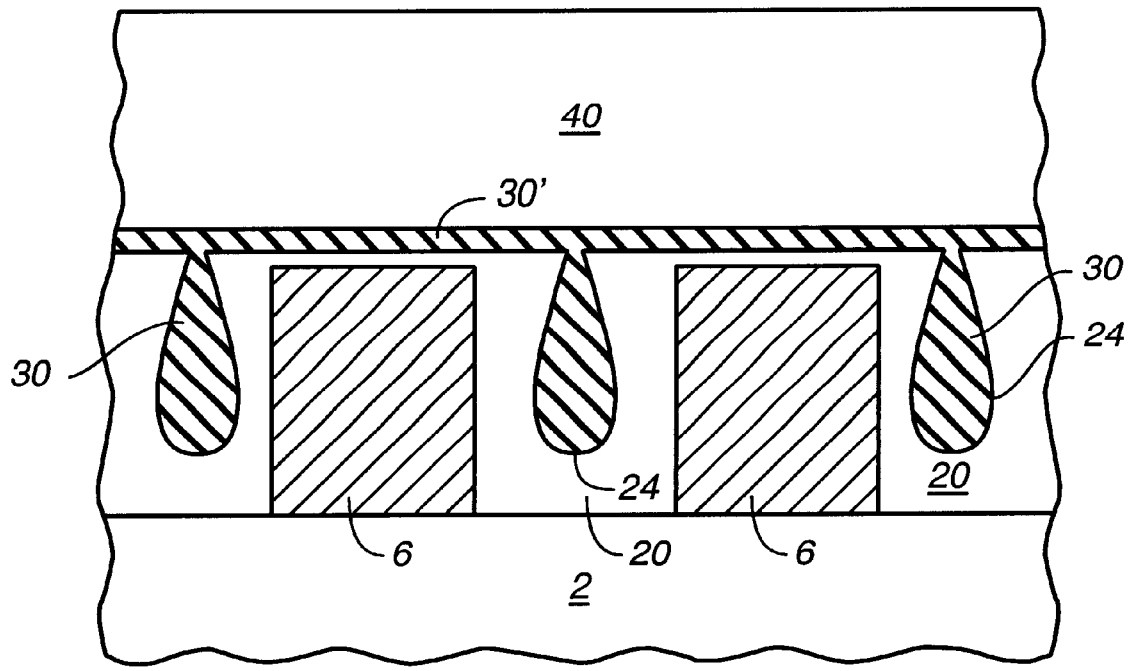
FIG._5B
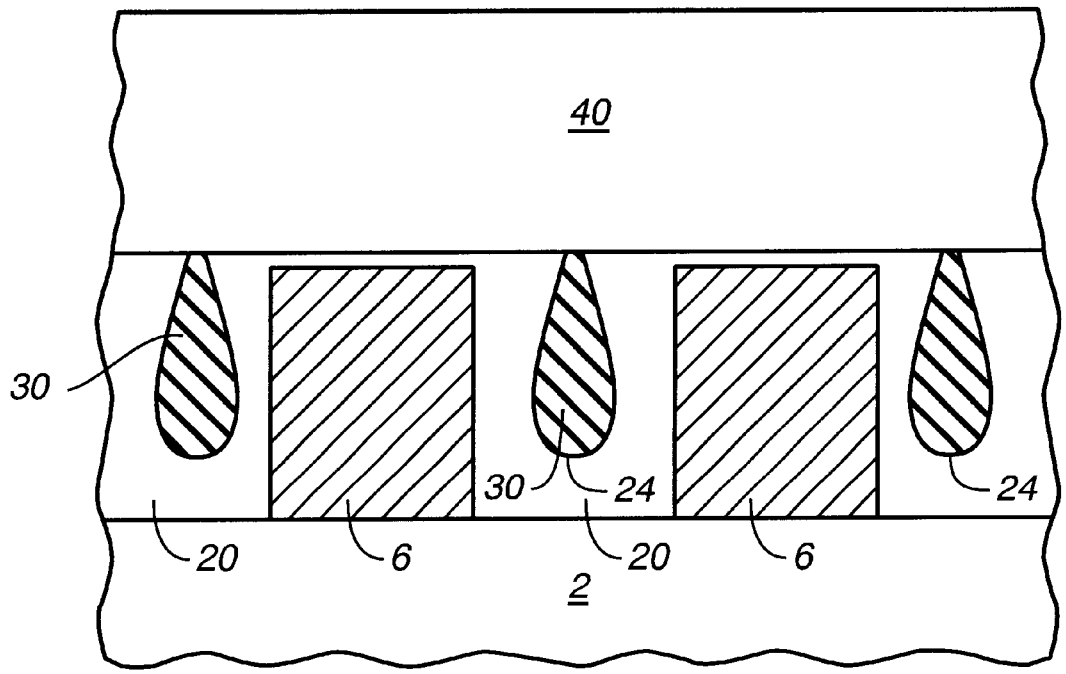
FIG._5C

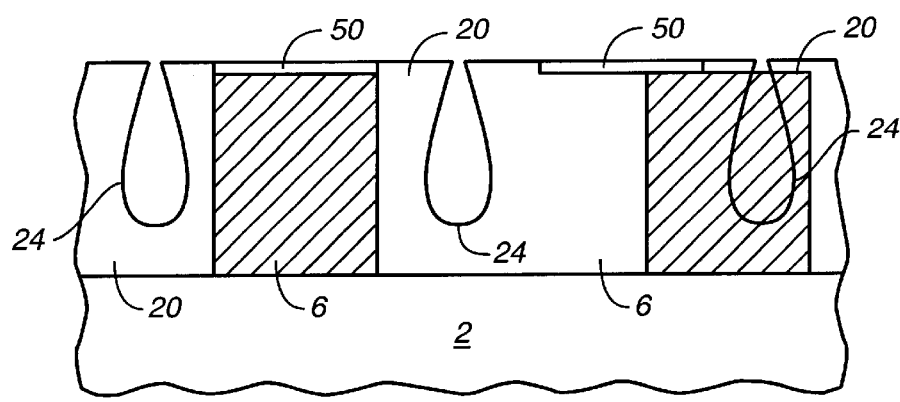
FIG._6
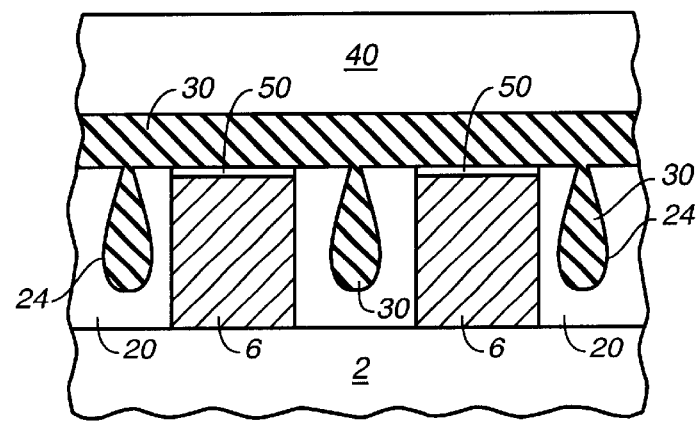
FIG._7A
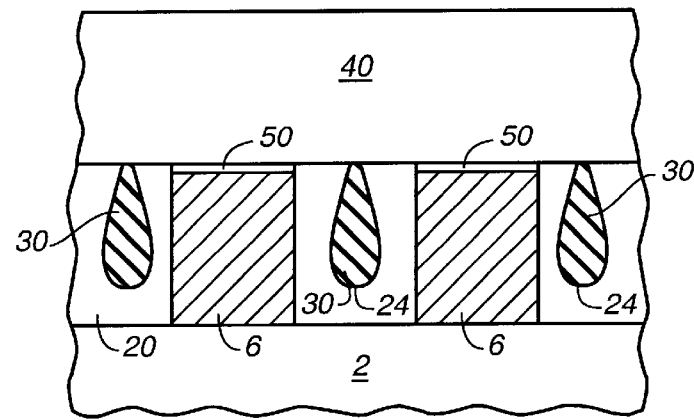
FIG._7B

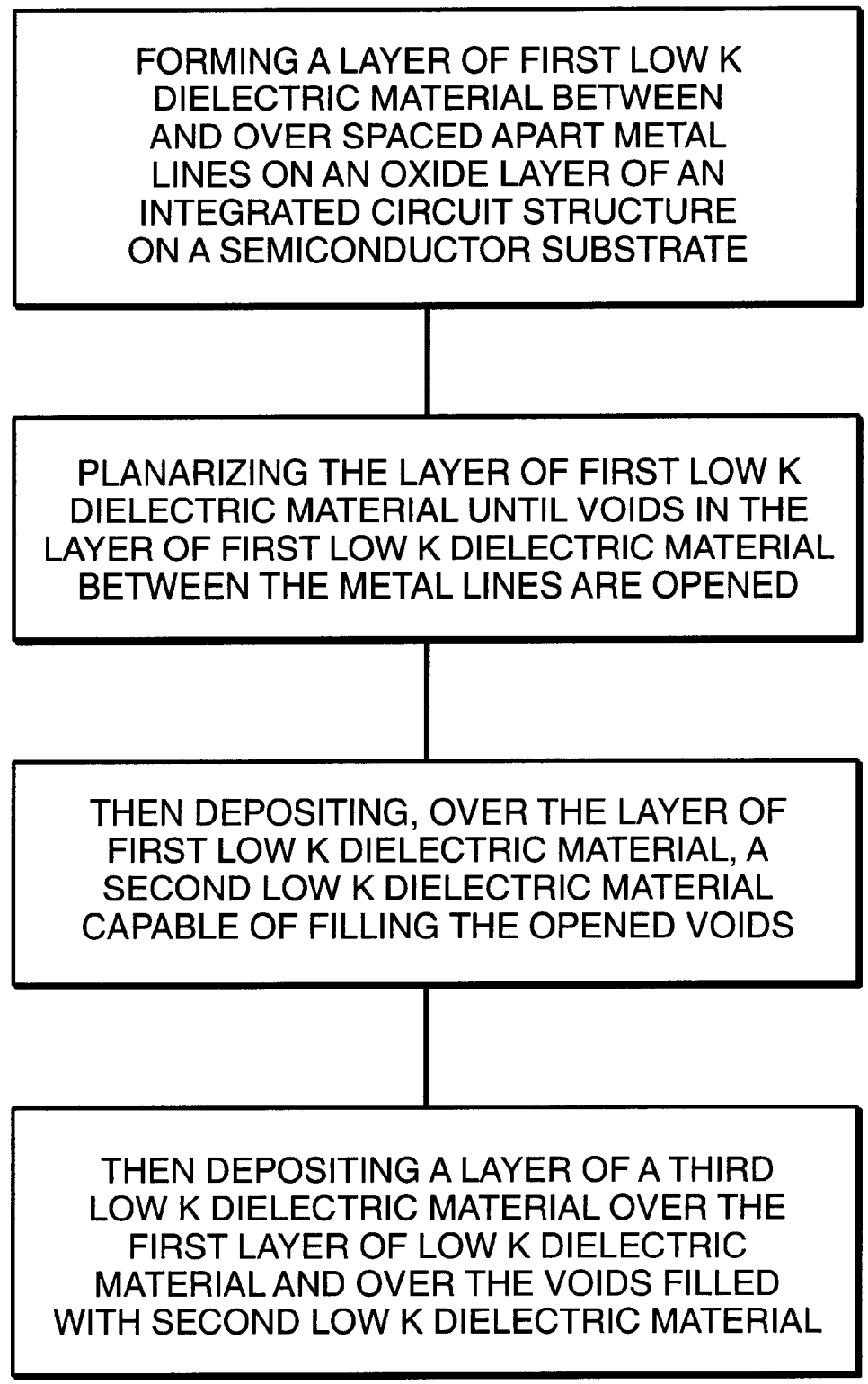
FIG._8

PROCESS FOR FORMING LOW K DIELECTRIC MATERIAL BETWEEN METAL LINES

CROSS REFERENCE TO RELATED APPLICATIONS

The subject matter of this application relates to the subject matter of copending application docket number B3-4236, entitled "PROCESS FOR CMP REMOVAL OF EXCESS TRENCH OR VIA FILLER METAL WHICH INHIBITS FORMATION OF CONCAVE REGIONS ON OXIDE SURFACE OF INTEGRATED CIRCUIT STRUCTURE", assigned to the assignee of this application, and filed on the same date as this application.

The subject matter of this application relates to the subject matter of copending application docket number 00-235, entitled "PROCESS FOR FORMING INTEGRATED CIRCUIT STRUCTURE WITH LOW DIELECTRIC CONSTANT MATERIAL BETWEEN CLOSELY SPACED APART METAL LINES", assigned to the assignee of this application, and filed on the same date as this application.

The subject matter of this application relates to the subject matter of copending application docket number 00-439, entitled "PROCESS FOR PLANARIZATION OF METAL-FILLED TRENCHES OF INTEGRATED CIRCUIT STRUCTURES", assigned to the assignee of this application, and filed on the same date as this application.

The subject matter of this application relates to the subject matter of copending U.S. patent application Ser. No. 09/425,552, filed on Oct. 22, 1999, entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", and assigned to the assignee of this application.

The subject matter of this application relates to the subject matter of copending U.S. patent application Ser. No. 09/605,380, filed on Jun. 27, 2000, entitled "COMPOSITE LOW DIELECTRIC CONSTANT FILM FOR INTEGRATED CIRCUIT STRUCTURE", and assigned to the assignee of this application.

BACKGROUND OF THE INVENTION

1. Field of the Invention

This invention relates to a process for forming integrated circuit structures. More particularly, this invention relates to a process for filling spaces between metal lines with low k dielectric material to reduce capacitance between the metal lines.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$-$SiH_3$) with hydrogen peroxide ($H_2O_2$) to form monosilicic acid which condenses on a cool wafer and is converted into an amorphous methyl-doped silicon oxide which is annealed at 400° C. to remove moisture.

The use of low k carbon-doped silicon oxide dielectric material formed by reacting methyl silane with hydrogen peroxide (the Trikon process) has been found to have good gap filling characteristics, resulting in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, the substitution of such low k carbon-doped silicon oxide dielectric materials formed by the Trikon process for conventional (non-low k) silicon oxide insulation has not been without its own problems. Formation of low k carbon doped silicon oxide dielectric material by the Trikon process is much slower than the conventional formation of undoped silicon oxide dielectric material. For example, in the time it takes to form a layer of low k carbon-doped silicon oxide dielectric material by the Trikon process on a single wafer, it may be possible to deposit a conventional silicon oxide dielectric layer of the same thickness on as many as 5 wafers.

However, even more importantly, it has been found that the subsequent formation of vias, or contact openings, through such low k carbon-doped silicon oxide dielectric material formed by the Trikon process to the underlying conductive portions such as metal lines, or contacts on an active device, can contribute to a phenomena known as via poisoning wherein filler material subsequently deposited in the via, such as a titanium nitride liner and tungsten filler material, fails to adhere to the via surfaces, apparently due to residues remaining from formation of the via in the particular low k dielectric material.

It has been proposed to solve the problem of via poisoning by forming such low k carbon-doped silicon oxide dielectric material by the Trikon process only between the metal lines, and then using a different dielectric material above the metal lines in the region of dielectric material through which vias will be formed down to the metal lines. Such a process is described and claimed in copending U.S. patent application Ser. No. 09/425,552 filed on Oct. 22, 1999 by two of us with another and assigned to the assignee of this application. The disclosure in that patent application is hereby incorporated herein by reference.

While termination of the height of a layer of Trikon process low k carbon-doped silicon oxide dielectric layer at the top of the metal lines inhibits the problem of via poisoning, the continued shrinkage of metal line widths and metal line spacing has given rise to the formation of borderless vias wherein the width of the via matches, or even exceeds the width of the metal line. This borderless via technology, coupled with possible misalignment of the via with the underlying metal line, can result in penetration of the via etch to dielectric levels below the top surface of the metal line, as shown in prior art FIG. 1.

In FIGS. 1A and 1B, a metal line 6 is shown formed over an integrated circuit structure 2, with a first low k dielectric material 10, such as the low k carbon-doped silicon oxide dielectric material formed by the Trikon process, shown formed adjacent the sides and up to the top of metal line 6. A layer of second low k dielectric material 12 is shown formed above first low k dielectric material 10. The layer of second low k dielectric material 12 comprises a PECVD-formed low k dielectric material which is more resistant to via poisoning.

When a via 14 is cut through second dielectric material 12, and the via 14 is misaligned with metal line 6, a portion of the via etch continues into first low k dielectric material 10 at the side of metal line 6, as shown at A. When via 14 extends down into first low k dielectric material 10 below the top of metal line 6, and the layer of first low k dielectric material 10 is formed by the Trikon process, problems similar to the aforementioned via poisoning can occur in this region.

It has also been proposed to deposit, in the regions between closely spaced apart metal lines, low k dielectric material formed by other processes such as by plasma enhanced chemical vapor deposition (PECVD), using $CH_4$ and/or $C_4F_8$ and/or silicon tetrafluoride ($SiF_4$) with a mixture of silane, $O_2$, and argon gases. Plasma enhanced chemical vapor deposition (PECVD), in general, is described more fully by Wolf and Tauber in "Silicon Processing for the VSLI Era", Volume 1-Process Technology (1986), at pages 171–174. The use of such low k dielectric materials apparently does not result in the same via poisoning problems when exposed to etching. Furthermore, the formation of low k silicon oxide dielectric material such as low k carbon-doped silicon oxide dielectric material by PECVD is much faster than the formation of a layer of low k carbon-doped silicon oxide dielectric layer of the same thickness by the Trikon (i.e., at rates approaching the deposition rate of conventional silicon oxide).

However, low k silicon oxide dielectric material deposited by PECVD has poor gap filling characteristics in high aspect ratio regions, resulting in the formation of voids in dielectric materials deposited by PECVD in the spaces between the closely spaced apart metal lines in such structures. Such voids are undesirable because they may be inadvertently opened during subsequent processing, resulting in the trapping of etch residues and other difficult to remove materials in the subsequently opened voids.

It would, therefore, be highly desirable to provide a process for the formation of low k dielectric material adjacent closely spaced apart metal lines in an integrated circuit structure wherein the problems relating to borderless vias, misaligned vias, via poisoning, and void formation could be mitigated while providing the desired low k dielectric material adjacent the metal lines which results in reduction of the capacitance between the metal lines.

SUMMARY OF THE INVENTION

In a process for forming low k dielectric material between and over a plurality of spaced apart metal lines previously formed over a dielectric layer of an integrated circuit structure, the steps which include: depositing, over and between the plurality of metal lines, a first low k dielectric material resistant to via poisoning; then planarizing the layer of first low k dielectric material sufficiently to open voids formed in the first low k dielectric material between the metal lines; then depositing, over the layer of first low k dielectric material and. into the opened voids, a layer of second low k dielectric material capable of filling the opened voids in the layer of first low k dielectric material; and then depositing a third low k dielectric material resistant to via poisoning over the first low k dielectric material and the voids filled with second low k dielectric material.

BRIEF DESCRIPTION OF THE DRAWINGS

FIG. 1A is a fragmentary vertical cross-sectional view of a prior art misaligned via formed over and next to the sidewall of a metal line.

FIG. 1B is a top view of the prior art structure of FIG. 1A.

FIG. 2 is a fragmentary vertical cross-sectional view of an integrated circuit structure showing closely spaced apart metal lines of an integrated circuit with a PECVD layer of low k dielectric material formed between and over the metal lines, and with voids formed in the dielectric material between the metal lines.

FIG. 3 is a fragmentary vertical cross-sectional view of the structure of FIG. 2 after a planarization step to open the voids.

FIG. 4 is a fragmentary vertical cross-sectional view of the structure of FIG. 3 after deposition of a layer of a second low k dielectric material capable of filling the voids in the first low k dielectric material.

FIG. 5A is a fragmentary vertical cross-sectional view of the structure of FIG. 4 after deposition of a PECVD layer of further low k dielectric material over the layer of second low k dielectric material.

FIG. 5B is a fragmentary vertical cross-sectional view of the structure of FIG. 4 after a CMP step to reduce the thickness of the layer of second low k dielectric material above the metal lines, and a subsequent deposition of a PECVD layer of further low k dielectric material over the structure.

FIG. 5C is a fragmentary vertical cross-sectional view of the structure of FIG. 4 after a CMP step to remove all of the layer of second low k dielectric material above the metal lines, and showing a subsequent deposition of a PECVD layer of further low k dielectric material over the structure.

FIG. 6 is a fragmentary vertical cross-sectional view of the structure formed by an another embodiment of the process of the invention showing a modified structure of FIG. 3 after planarization of the layer of first low k dielectric material down to caps on the metal lines which serve as etch stops for the planarization step.

FIG. 7A is a fragmentary vertical cross-sectional view of the embodiment of FIG. 6 showing a layer of second low k dielectric material formed over the planarized layer of first low k dielectric material to fill the voids, and also showing a subsequent deposition of a PECVD layer of further low k dielectric material over the structure.

FIG. 7B is a fragmentary vertical cross-sectional view of the embodiment of FIG. 6 showing a layer of second low k dielectric material formed over the planarized layer of first low k dielectric material to fill the voids and planarization of the layer of second low k dielectric material also down to the caps on the metal lines which then also serve as etch stops for the step of planarizing the layer of second low k dielectric material, and also showing a subsequent deposition of a PECVD layer of further low k dielectric material over the structure.

FIG. 8 is a flowsheet illustrating the process of the invention.

DETAILED DESCRIPTION OF THE INVENTION

The invention comprises a process for forming low k dielectric material between and over a plurality of spaced apart metal lines previously formed over a dielectric layer of an integrated circuit structure, including the steps of depositing, over and between the plurality of metal lines, a first low k dielectric material resistant to via poisoning; then planarizing the layer of first low k dielectric material sufficiently to open the voids formed in the first low k dielectric material between the metal lines; then depositing over the layer of first low k dielectric material a layer of second low k dielectric material capable of filling the opened voids in the layer of first low k dielectric material; and then depositing a third low k dielectric material resistant to via poisoning over the first low k dielectric material and the voids filled with second low k dielectric material.

By use of the term "low k" herein, with respect to the dielectric constant of the dielectric material, is intended to define a dielectric constant of a dielectric material of 3.5 or less. Preferably, the dielectric constant of a "low k" material will be 3.0 or less.

FIG. 2 illustrates the first step of the process of the invention. Closely spaced apart metal lines 6 are shown formed over an integrated circuit structure 2 with a layer of a first low k dielectric material 20 resistant to via poisoning shown formed between and over metal lines 6. Voids 24 are shown formed in first low k dielectric material 20 between metal line 6. By use of the term "closely spaced apart" with respect to the spacing of the metal lines is meant a spacing as small as 200 nanometers (nm) between adjacent metal lines.

First low k dielectric material 20 preferably is formed by a plasma enhanced chemical vapor deposition (PECVD), using a carbon-doped silane and an oxygen-containing gas (such as $O_2$, CO, $N_2O$, or mixtures of such oxygen-containing gases). Examples of carbon-doped silanes which may be used include methylsilane, dimethylsilane, trimethylsilane, or tetramethylsilane; as well as those carbon-doped silanes described and claimed in copending U.S. patent application Ser. No. 09/274,457, filed Mar. 22, 1999 and assigned to the assignee of this application, and the subject matter of which is hereby incorporated. by reference.

In a typical PECVD process to form a layer of first low k dielectric material 20 with a dielectric constant of less than about 3.0, the reactor is maintained with a temperature range of from about 10° C. to about 400° C. and at a pressure range of from about 1,000 millitorr to about 4,000 millitorr, and a plasma is maintained within the reactor at a power level of from about 200 watts to about 1,000 watts during the deposition. Typical process gases are flowed into a 5 liter reactor at the rate of, in standard cubic centimeters/minute (sccm), 100 sccm to 500 sccm of a methyl-substituted silane such as $(CH_3)SiH_3$, and 100 sccm to 500 sccm of an oxygen-containing gas such as $O_2$. Such flow rates may be suitably adjusted for other size reactors.

Such formation of PECVD low k dielectric materials is described more fully in previously referenced copending U.S. patent application Ser. No. 09/605,380, the subject matter of which is hereby incorporated herein by reference. As mentioned earlier, conventional plasma enhanced chemical vapor deposition (PECVD) is described more fully by Wolf and Tauber in "Silicon Processing for the VSLI Era", Volume 1-Process Technology (1986), at pages 171–174.

The deposition of the layer of first low k dielectric material 20 is carried out until the sides and tops of metal lines 6 have been completely covered with first low k dielectric material 20, as shown in FIG. 2. As previously mentioned, PECVD-formed low k dielectric material forms voids when deposited in high aspect ratio regions. The formation of such voids 24 are shown in FIG. 2 in the spaces between closely spaced apart metal lines 6. The presence of such voids in a layer of dielectric material can cause problems during subsequent processing of the integrated circuit structure if such voids are inadvertently opened during such subsequent processing resulting in the deposit and accumulation of processing residues which must then be removed to prevent undesirable outgassing.

In accordance with the process of the invention, voids 24 formed during the deposition of the PECVD-formed layer of first low k dielectric material 20 are opened in a second step of the process by subjecting first low k dielectric material 20 to a planarizing step which removes a sufficient amount of first low k dielectric material 20 to open the voids formed in first low k dielectric material 20 during the initial deposition step, as shown in FIG. 3. In a preferred embodiment, the planarization step is carried out using a chemical mechanical polishing (CMP) process in which a slurry containing one or more etchants and an abrasive is applied to the surface of the material being planarized. When first low k dielectric material 20 comprises a carbon-doped silicon oxide low k dielectric material, an oxide slurry may be used in the CMP process. CMP processing equipment and slurries for the planarization and/or removal of material such as carbon-doped silicon oxide are commercially available.

The CMP process is carried out until voids 24 in low k dielectric material are opened, as shown in FIG. 3. The process time needed to open the voids may be determined empirically by stopping the process and physically examining the surface under a microscope. Preferably, the process is terminated before exposure of the top surface of metal lines 6 to avoid chemical attack and corrosion of the metal lines by the chemicals in the slurry. After cessation of the CMP process, the structure may be rinsed and dried to remove polishing residues from the surface, including the surfaces of the opened voids.

As shown in FIG. 4, voids 24 are then filled in a subsequent step by deposition of a layer of a second low k dielectric material 30 characterized by its capability of flowing during formation to permit filling of high aspect ratio volumes such as voids 24. Second low k dielectric material 30 may be formed by reacting a mild oxidant such as hydrogen peroxide ($H_2O_2$) with any of the carbon-doped silanes described above with respect to the formation of first low k dielectric material 20, including methylsilane, dimethylsilane, trimethylsilane, or tetramethylsilane; as well as those carbon-doped silanes described and claimed in the aforementioned copending U.S. patent application Ser. No. 09/274,457.

The formation and deposition of second low k dielectric material 30 is carried out until all of the previously opened voids 24 are filled with second low k dielectric material 30. Typically from about 50 nm to about 100 nm of second low k dielectric material is deposited over the upper surface of first low k dielectric material 20 to ensure complete filling of voids 24 with second low k dielectric material 30.

After voids 24 have been filled with second low k dielectric material 30, a layer of a third low k dielectric material 40 is deposited over second low k dielectric material 30, as shown in FIG. 5A. Third low k dielectric material 40 may comprise the same material as first low k dielectric material 20 or any other low k dielectric material through which vias may be etched without damage to the third low k dielectric material such as the previously described via poisoning.

The structure of FIG. 5A provides first low k dielectric material 20 adjacent the sidewalls of metal lines 6 which is resistant to corrosion from misaligned vias in borderless via technology wherein some of the low k dielectric material 20 will be etched away adjacent the sidewalls of the metal lines 6. However, it will be noted that any via (even a perfectly aligned via) must pass through the both the layer of third low k dielectric material 40 and the layer of second low k dielectric material 30 to reach the top surface of metal line 6. Since second low k dielectric material comprises a material which, while having excellent flow properties for filling high aspect regions of an integrated circuit structure, is susceptible to via poisoning when exposed to via etching therethrough, it would be desirable to minimize such exposure.

As shown in FIG. 5B, this can be done by subjecting the structure to further planarization, such as the previously described CMP processing, thereby removing some or most of the second low k dielectric material 30 deposited on the upper surface of first low k dielectric material 20 by a second planarization step such as a second CMP step, leaving a thin layer 30' of second low k dielectric material 30, e.g., about 10–20 nm, over first low k dielectric material 20.

While the structure of FIG. 5B results in greatly lowering the amount of second low k dielectric material which will be contacted during subsequent via formation, it would be particularly advantageous if all of the second low k material not in the filled voids 24 could be removed from the upper surface of first low k dielectric material 20. FIG. 5C shows such a result. This can be carried out by stopping the above described second CMP step when the upper surface of first low k dielectric material 20 is exposed, as shown in FIG. 5C.

As shown in FIG. 5C, all of second low k dielectric material 30 may be removed from the upper surface of first low k dielectric material 20. While the embodiment shown in FIG. 5C has the advantage of no second low k dielectric material 30 over metal lines 6 through which a via would be cut down to metal lines 6, it would require closer control of the CMP process to avoid excessive polishing to expose the top surface of metal lines 6 for the reasons previously discussed.

In an alternate embodiment, the top surface of metal lines 6 may be protected from the CMP process in another manner, as shown in FIG. 6. In the embodiment shown in FIGS. 6 and 7A–7B, protective caps 50; which may comprise either a dielectric material or an electrically conductive material, may be formed over the top surfaces of metal lines 6. Such protective caps 50 may then function as an etch stop for subsequent planarization of the low k layers formed between and over metal lines 6. Such protective caps may be formed by formation of a layer of the cap material over the metal layer or layers prior to masking and patterning the metal layers to define the metal lines. Examples of dielectric materials which may be used in the formation of protective caps 50 include silicon nitride and silicon oxynitride.

The use of silicon oxynitride caps over metal lines is described and claimed in copending U.S. patent application Ser. No. 09/425,552 entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", filed on Oct. 22, 1999, and assigned to the same assignee as this application. The subject matter of U.S. patent application Ser. No. 09/425,552 is hereby incorporated by reference.

The use of silicon nitride caps over metal lines is described and claimed in copending application docket number 00-235, entitled "PROCESS FOR FORMING INTEGRATED CIRCUIT STRUCTURE WITH LOW DIELECTRIC CONSTANT MATERIAL BETWEEN CLOSELY SPACED APART METAL LINES", assigned to the assignee of this application, filed on the same date as this application, and the subject matter of which is hereby incorporated by reference.

Examples of electrical conductive materials which could be used for formation of protective caps 50 include titanium nitride and tantalum nitride. It should be noted that if the material chosen for protective caps 50 is a dielectric material, rather than an electrically conductive material, vias subsequently cut through the overlying third low k dielectric material 40 will also have to be cut through such dielectric material used to form protective caps 50.

After forming the layer of first low k dielectric material between and over metal lines 6 (with protective caps 50 thereon), the CMP process previously described with respect to FIG. 3 would then be carried out to open voids 24, with the process stopping at protective caps 50, as shown in FIG. 6, with the result that no first low k dielectric material would be left above the top surface of protective caps 50.

The process may then continue by the deposition of the flowable second low k material 30 over the remaining upper surfaces of first low k dielectric material 20 between metal lines 6, and in voids 24 to fill the voids, as described in the previous embodiment. Then, without a further planarizing step, the layer of third low k dielectric material 40 may be deposited over second low k dielectric material 30, resulting in the structure shown in FIG. 7A.

However, in view of the presence of protective caps 50 over metal lines 6, and the desirability of removing all second low k dielectric material 30 in regions where vias will be subsequently formed, it is preferably to conduct a second planarization step after the deposition of second low k dielectric material 30 to remove all of second low k dielectric material 30 above the level of the top surfaces of protective caps 50. As in the first planarization step, the preferred form of planarization is a CMP step to polish away all second low k dielectric material 30 over protective caps 50 and over first dielectric material 20 between metal lines 6, leaving second low k dielectric material 30 only in voids 24, as shown in FIG. 7B. The layer of third low k dielectric material 40 is then formed over the structure.

When vias are then subsequently formed down to protective caps 50 on metal lines 6, such vias do not pass through any of second low k dielectric material 30 which is prone to via poisoning. Furthermore, as in the previous embodiment, any misalignment of the via will result in the misaligned portion of the via extending into the first low k dielectric material 20 surround the sidewalls of metal lines 6, and not into second low k dielectric material 30, again averting prior art problems encountered when a misaligned via extended down into second low k dielectric material 30.

Thus, the process of the invention provides for the formation of low k dielectric material adjacent closely spaced apart metal lines in an integrated circuit structure wherein problems relating to borderless vias, misaligned vias, via poisoning, and void formation are mitigated while still providing low k dielectric material between and over the metal lines which results in desired reduction of the capacitance between the metal lines.

Having thus described the invention what is claimed is:

1. In a process for forming low k dielectric material between and over a plurality of spaced apart metal lines previously formed over a dielectric layer of an integrated circuit structure, the steps which include:
    a) depositing, over and between said plurality of metal lines, a first layer of a first low k dielectric material;
    b) then planarizing said layer of first low k dielectric material sufficiently to open voids formed in said first low k dielectric material between said metal lines;
    c) then depositing, over said layer of first low k dielectric material and into said opened voids, a second low k dielectric material capable of filling said opened voids in said layer of first low k dielectric material; and
    d) then depositing a layer of a third low k dielectric material over said first low k dielectric material and said voids filled with said second low k dielectric material.

2. The process of claim 1 wherein said step of depositing said first low k dielectric material further comprises depositing low k dielectric material resistant to via poisoning.

3. The process of claim 1 wherein said step of depositing said first low k dielectric material further comprises depositing first low k dielectric material by a plasma enhanced chemical vapor deposition (PECVD) process.

4. The process of claim 3 wherein said step of depositing said first low k dielectric material further comprises reacting together a carbon-doped silane and an oxygen-containing gas other than hydrogen peroxide in the presence of a plasma.

5. The process of claim 4 wherein said carbon-doped silane is selected from the group consisting of methylsilane, dimethylsilane, trimethylsilane, and tetramethylsilane.

6. The process of claim 4 wherein said carbon-doped silane comprises a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic aliphatic.

7. The process of claim 4 wherein said oxygen-containing gas is selected from the group consisting of $O_2$, CO, $N_2O$, or mixtures of such oxygen-containing gases.

8. The process of claim 1 wherein said step of planarizing said layer of first low k dielectric material sufficiently to open voids formed in said first low k dielectric material between said metal lines further comprise using a chemical mechanical polish (CMP) process to open said voids in said first low k dielectric material between said metal lines.

9. The process of claim 8 wherein said step of planarizing said layer of first low k dielectric material sufficiently to open said voids is terminated prior to exposure of the upper surface of said metal lines.

10. The process of claim 1 wherein said step of depositing, over said layer of first low k dielectric material and into said opened voids, a second low k dielectric material capable of filling said opened voids further comprises depositing a low k carbon-doped silicon oxide dielectric material formed by reacting a carbon-doped silane with hydrogen peroxide.

11. The process of claim 10 wherein said carbon-doped silane is selected from the group consisting of methylsilane, dimethylsilane, trimethylsilane, and tetramethylsilane.

12. The process of claim 10 wherein said carbon-doped silane comprises a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic aliphatic.

13. The process of claim 1 wherein a second planarization step is carried out after said step of filling said voids with said second low k dielectric material to remove at least some of said second low k dielectric material from the upper surface of said first layer of first low k dielectric material.

14. The process of claim 1 wherein a second planarization step is carried out after said step of filling said voids with said second low k dielectric material to remove substantially all of said second low k dielectric material from the upper surface of said first layer of first low k dielectric material.

15. The process of claim 1 wherein said step of depositing a layer of a third low k dielectric material over said first low k dielectric material and said voids filled with said second low k dielectric material further comprises depositing a further layer of said first low k dielectric material over said first layer of first low k dielectric material and said voids filled with said second low k dielectric material.

16. In a process for forming low k dielectric material between and over a plurality of spaced apart metal lines previously formed over a dielectric layer of an integrated circuit structure, the steps which include:
    a) depositing, over and between said plurality of metal lines, a first layer of a first low k dielectric material formed by a plasma enhanced chemical vapor deposition (PECVD) reaction between a carbon-doped silane and an oxygen-containing gas other than hydrogen peroxide;
    b) then using a CMP process to polish said first layer of first low k dielectric material sufficiently to open voids formed in said first low k dielectric material between said metal lines;
    c) then depositing, over said first layer of first low k dielectric material and into said opened voids, a second low k dielectric material capable of filling said opened voids in said first layer of first low k dielectric material, and formed by reacting a carbon-doped silane with hydrogen peroxide; and
    d) then depositing a second layer of said first low k dielectric material over said first layer of first low k dielectric material and said voids filled with said second low k dielectric material.

17. The process of claim 16 wherein said metal lines are formed with protective caps on the upper surface of said metal lines and said step of then using a CMP process to polish said first layer of first low k dielectric material sufficiently to open voids formed in said first low k dielectric material between said metal lines is carried out until said protective caps are exposed, whereby said protective caps function as an etch stop for said CMP process.

18. The process of claim 17 wherein a second planarization step is carried out after said step of filling said voids with said second low k dielectric material to remove substantially all of said second low k dielectric material from the upper surface of said first layer of first low k dielectric material.

19. The process of claim 18 wherein said protective caps on said metal lines function as an etch stop for said second planarization step.

20. In a process for forming low k dielectric material between and over a plurality of spaced apart metal lines having protective caps thereon and previously formed over a dielectric layer of an integrated circuit structure, the steps which include:
    a) depositing, over and between said plurality of metal lines, a layer of a first low k dielectric material;

b) then planarizing said layer of first low k dielectric material to open voids formed in said first low k dielectric material between said metal lines until said protective caps are exposed, whereby said protective caps function as an etch stop for said planarization process;

c) then depositing, over said layer of first low k dielectric material and into said opened voids, a second low k dielectric material capable of filling said opened voids in said layer of first low k dielectric material;

d) then planarizing said second low k dielectric material until said protective caps on said metal lines are exposed to thereby remove substantially all of said second low k dielectric material from the upper surface of said layer of first low k dielectric material; and e) then depositing a layer of a third low k dielectric material over said first low k dielectric material and said voids filled with said second low k dielectric material.

* * * * *